US010883648B2

(12) United States Patent
Notohardjono et al.

(10) Patent No.: US 10,883,648 B2
(45) Date of Patent: Jan. 5, 2021

(54) LEVELING AND STABILIZATION OF WEIGHT BIASED LOADS

(71) Applicant: INTERNATIONAL BUSINESS MACHINES CORPORATION, Armonk, NY (US)

(72) Inventors: Budy Notohardjono, Poughkeepsie, NY (US); Richard Ecker, Poughkeepsie, NY (US); Suraush Khambati, Poughkeepsie, NY (US); Shawn Canfield, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/284,075

(22) Filed: Feb. 25, 2019

(65) Prior Publication Data

US 2020/0271265 A1 Aug. 27, 2020

(51) Int. Cl.
*F16M 11/00* (2006.01)
*F16M 7/00* (2006.01)
*F16M 11/22* (2006.01)
*H05K 5/02* (2006.01)
*H05K 7/18* (2006.01)

(52) U.S. Cl.
CPC ............. *F16M 7/00* (2013.01); *F16M 11/22* (2013.01); *H05K 5/0234* (2013.01); *F16M 2200/08* (2013.01); *H05K 7/18* (2013.01)

(58) Field of Classification Search
CPC .......... A61G 7/05707; B62J 1/20; A47C 4/54
See application file for complete search history.

(56) References Cited

U.S. PATENT DOCUMENTS

| 3,935,605 | A | | 2/1976 | Hutchinson |
| 3,978,805 | A | | 9/1976 | Thomas |
| 4,143,435 | A | | 3/1979 | Masuda |
| 4,605,582 | A | * | 8/1986 | Sias ............... A61G 7/05707 428/120 |
| 5,195,439 | A | | 3/1993 | Harder |
| 5,607,243 | A | | 3/1997 | Szarka |

(Continued)

FOREIGN PATENT DOCUMENTS

| CN | 2413266 Y | 1/2001 |
| CN | 106276728 A | 5/2018 |

(Continued)

*Primary Examiner* — Amy J. Sterling
(74) *Attorney, Agent, or Firm* — Tihon Poltavets (57) ABSTRACT

An apparatus for leveling and stabilizing weight biased loads includes a base with a plurality of structural members protruding from a top planar surface of the base. The apparatus further includes the plurality of structural members having two or more tiers, wherein each of the two or more tiers includes at least one structural member from the plurality of structural members. The apparatus further includes a platform disposed on a first tier out of the two or more tiers of the plurality of structural members, wherein a bottom planar surface of the platform is disposed on a top planar surface of at least one structural member of the first tier, wherein each of the two or more tiers of the plurality of structural members provides sequential load support for a weight biased load disposed on the platform.

12 Claims, 5 Drawing Sheets

(56) References Cited

U.S. PATENT DOCUMENTS

| | | | |
|---|---|---|---|
| 7,587,776 B2 * | 9/2009 | Poulos | A61G 7/05776 |
| | | | 5/713 |
| 7,648,198 B1 * | 1/2010 | Matsler | B62J 1/20 |
| | | | 297/200 |
| 9,227,757 B1 | 1/2016 | Green et al. | |
| 2003/0030319 A1 * | 2/2003 | Clapper | A47C 4/54 |
| | | | 297/452.41 |
| 2003/0037710 A1 | 2/2003 | Monson et al. | |
| 2006/0254476 A1 * | 11/2006 | MacDonald | B65D 19/0038 |
| | | | 108/53.3 |
| 2007/0221102 A1 | 9/2007 | Reinhall | |
| 2007/0283858 A1 | 12/2007 | Ballard | |
| 2011/0132238 A1 | 6/2011 | Jaegers et al. | |
| 2011/0210027 A1 | 9/2011 | Decroix | |
| 2018/0141705 A1 | 5/2018 | Erm | |

FOREIGN PATENT DOCUMENTS

| | | |
|---|---|---|
| EP | 429363 B1 | 5/1994 |
| EP | 1753288 B1 | 1/2014 |
| KR | 200306412 Y1 | 2/2003 |

* cited by examiner

LEVELING AND STABILIZATION OF WEIGHT BIASED LOADS

FIELD OF THE INVENTION

This disclosure relates generally to load leveling and stabilization, and in particular, to an apparatus for leveling and stabilizing weight biased loads.

BACKGROUND OF THE INVENTION

A mainframe computer is an example of a tall and narrow structure that is prone to tipping while being transported on a pallet utilizing a forklift. A distribution of variously weighted hardware components is optimized based on packaging requirements rather than transporting requirements, often resulting in non-uniform and asymmetric weight distribution that exacerbates the susceptibility of the mainframe computer to tipping. Any uneven or rough ground surface on which the forklift operates, can create a load destabilization scenario where the mainframe computer tips or the supporting pallet collapses due to the non-uniform weight distribution. Either of the destabilization scenarios can result in damage to the mainframe computer and delays in delivering the mainframe computer to a customer site.

SUMMARY

One aspect of an embodiment of the present invention discloses an apparatus for leveling and stabilizing weight biased loads the apparatus comprising a base with a plurality of structural members protruding from a top planar surface of the base; the plurality of structural members includes two or more tiers, wherein each of the two or more tiers includes at least one structural member from the plurality of structural members; and a platform disposed on a first tier out of the two or more tiers of the plurality of structural members, wherein a bottom planar surface of the platform is disposed on a top planar surface of at least one structural member of the first tier, wherein each of the two or more tiers of the plurality of structural members provides sequential load support for a weight biased load disposed on the platform.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Embodiments of the present invention provide an apparatus for leveling and stabilization of weight biased loads, where the apparatus is a structure disposed or integrated into a movable platform (e.g., pallet). The structure includes a base with a plurality of members of varying heights protruding from the base, where the plurality of members are of a cushioning material, such as, rubber, foam, or any other elastic material. The plurality of members include at least two or more tiers of members which compress incrementally when a load is applied to a top planar surface of each of the plurality of members. Tiers of members are identified by a height and/or structural stiffness. As one tier of members begins to buckle and deform under the weight of a load, another tier of member begin to support the load. The combination and sequential loading of the plurality of members provides a leveling of the load against tilt and stabilization of the load against pitch.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure or first member, is present on a second element, such as a second structure or second member, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 1A:
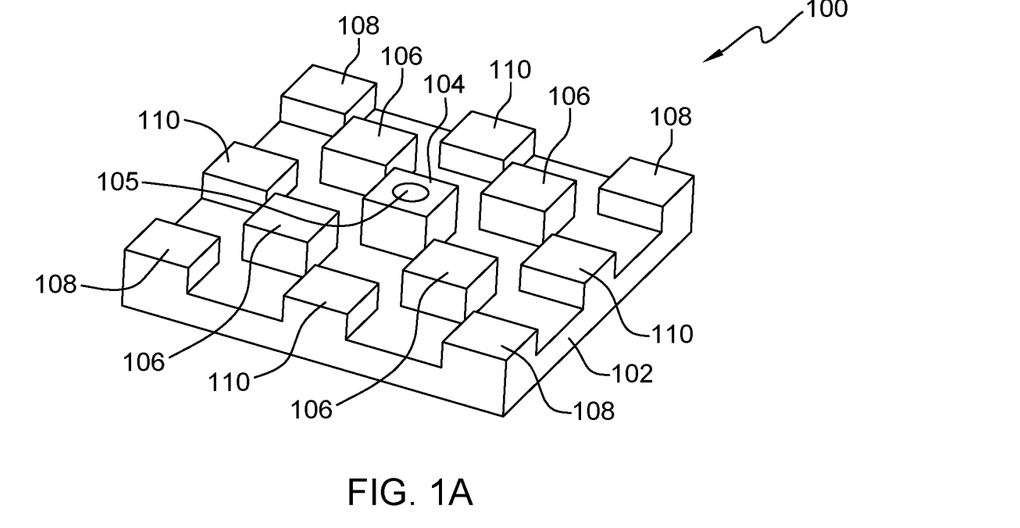
FIG. 1A depicts a three-dimensional view of a corner load leveling and stabilization structure, in accordance with an embodiment of the present invention.

FIG. 1A depicts a three-dimensional view of a corner load leveling and stabilization structure, in accordance with an embodiment of the present invention. In this embodiment, corner load leveling and stabilization structure 100 includes a three tier design for planar leveling and stabilization of a load with non-uniform or asymmetric weight distribution. Corner load leveling and stabilization structure 100 includes top-tier member 104, mid-tier member 106, corner lower-tier member 108, and side lower-tier member 110 symmetrically positioned on a top surface of base 102. In another embodiment, top-tier member 104, mid-tier member 106, corner lower-tier member 108, and side lower-tier member 110 are asymmetrically positioned on a top surface of base 102. Top-tier member 104, mid-tier member 106, corner lower-tier member 108, and side lower-tier member 110 each can be constructed from a cushioning material, such as rubber, foam, or honeycomb structured cardboard. The cushioning material can vary across top-tier member 104, mid-tier member 106, corner lower-tier member 108, and side lower-tier member 110, where one or more cushioning materials are utilized for corner load leveling and stabilization structure 100. Top-tier member 104, mid-tier member 106, corner lower-tier member 108, and side lower-tier member 110 have varying stiffness values defined by k=F/δ, where k is stiffness, F is the force applied to the body, and δ is a displacement resulting from the applied force F along a similar degree of freedom.

Base 102 includes top-tier member 104 protruding from a top surface along the positive y-axis, where a load is applied in the negative y-axis on a top planar surface of top-tier member 104. Cavity 105 of top-tier member 104 provides a guide and mounting location for a bolt to secure corner load leveling and stabilization structure 100 to a lower surface of a load. Cavity 105 can include a threaded surface along a circumference of an interior surface for accepting a screw to secure the load to the top planar surface of corner load leveling and stabilization structure 100. In other embodiment, cavity 105 of top-tier member 104 has the ability to match a shape of a protruding feature on a bottom planar surface of a load disposed on a top planar surface of top-tier member 104. Mid-tier members 106, corner lower-tier members 108, and side lower-tier members 110 can also include one or more cavities (not illustrated in FIG. 1A) for securing the load or matching a shape of a protruding feature on a bottom planar surface of a load.

Base 102 includes four mid-tier members 106 protruding from the top surface along the positive y-axis, where a top planar surface of any mid-tier member 106 is lower than the top planar surface of top-tier member 104 along the y-axis. As a result, the top planar surface of any mid-tier member 106 does not contact the lower surface of the load when the load initially contacts the top planar surface of top-tier member 104. In this embodiment, a height of each of the four mid-tier members 106 is equal, where the top planar surface for each of the four mid-tier members 106 is at a similar position on the same y-axis. In other embodiments, a height of each of the four mid-tier members 106 is different, where the planar surface for each of the four mid-tier members 106 is at a different position on the y-axis. An area for the top planar surface of each mid-tier member 106 is equal to an area of the top planar surface of top-tier member 104, where a volume of each mid-tier member 106 is less than a volume of top-tier member 104. In other embodiments, the area for the top planar surface of each mid-tier member 106 can vary depending on the load and requirements for corner load leveling and stabilization structure 100 to support the load if destabilization occurs.

Base 102 also includes four corner lower-tier members 108 and four side lower-tier members 110 protruding from the top surface along the positive y-axis, where a top planar surface of any corner lower-tier member 108 or side lower-tier member 110 is lower than the top planar surface of mid-tier member 106 along the y-axis. As a result, the top planar surface of any corner lower-tier member 108 or side lower-tier member 110 does not contact the lower surface of the load when the load initially contacts either the top planar surface of top-tier member 104 or mid-tier member 106. In this embodiment, a height of each of the four corner lower-tier members 108 and side lower-tier members 110 is equal, where the top planar surface for each of the four corner lower-tier members 108 and side lower-tier members 110 is at a similar position on the same y-axis. In other embodiments, a height of each of corner lower-tier members 108 and side lower-tier members 110 is different, where the planar surface for each of the four corner lower-tier members 108 and side lower-tier members 110 are at a different position on the y-axis. An area for the top planar surface of each corner lower-tier member 108 and side lower-tier member 110 is equal to an area of the top planar surface of top-tier member 104 and mid-tier member 106, where a volume of each corner lower-tier members 108 and side lower-tier members 110 is less than a volume of top-tier member 104 or mid-tier member 106. In other embodiments, the area for the top planar surface of each corner lower-tier member 108 and side lower-tier member 110 can vary depending on the load and requirements for corner load leveling and stabilization structure 100 to support the load if destabilization occurs.

Top-tier member 104, mid-tier member 106, corner lower-tier member 108, and side lower-tier member 110 provide a sequential loading application, where each member can support a designated weigh prior to buckling and transferring the weight to a lower member. In one example, a first portion of a load experienced by first corner load leveling and stabilization structure 100 in a neutral state (i.e., level ground) with 0 degrees of tilt is 325 lbs, where a total weigh of the load is 1500 lbs distributed across a total of four corner load leveling and stabilization structure 100. Due to the asymmetric distribution of weight for the load in the negative y-axis, each of the four corner load leveling and stabilization structure 100 support a different amount of weight. The first corner load leveling and stabilization structure 100 is configured such that a maximum weight supported by top-tier member 104 prior to buckling, is 425 lbs. Since the first corner load leveling and stabilization structure 100 includes four mid-tier members 106, each mid-tier member 106 is configured to support a maximum of 150 lbs prior to buckling. As a result, a total combined maximum weight supported across the four mid-tier members 106 is 600 lbs prior to buckling. Since the first corner load leveling and stabilization structure 100 includes four corner lower-tier members 108 and four side lower-tier members 110, each corner lower-tier members 108 and side lower-tier member 110 is configured to support a maximum of 100 lbs prior to buckling. As a result, a total combined maximum weight supported across the eight combined corner lower-tier members 108 and side lower-tier members 110 is 800 lbs prior to buckling.

In this embodiment, top-tier member 104, mid-tier member 106, corner lower-tier member 108, and side lower-tier member 110 include a cross-section (e.g., a top planar surface) that is square shaped. A cross-section for the various members of corner load leveling and stabilization structure 100 can include quadrilaterals, circles, or any design required for an application of supporting a load. The cross-section of the top planar surface for each of the various members can be dependent on a contact patch that is required for a bottom planar surface of a load. For example, a load being supported by corner load leveling and stabilization structure 100 does not have a flat bottom planar surface, but rather has a bottom planar surface with one or more protruding features. Each of the top-tier member 104, mid-tier member 106, corner lower-tier member 108, and side lower-tier member 110 of corner load leveling and stabilization structure 100 can be shaped and positioned to match the one or more protruding features of the bottom planar surface of the load.

Figure 1B:
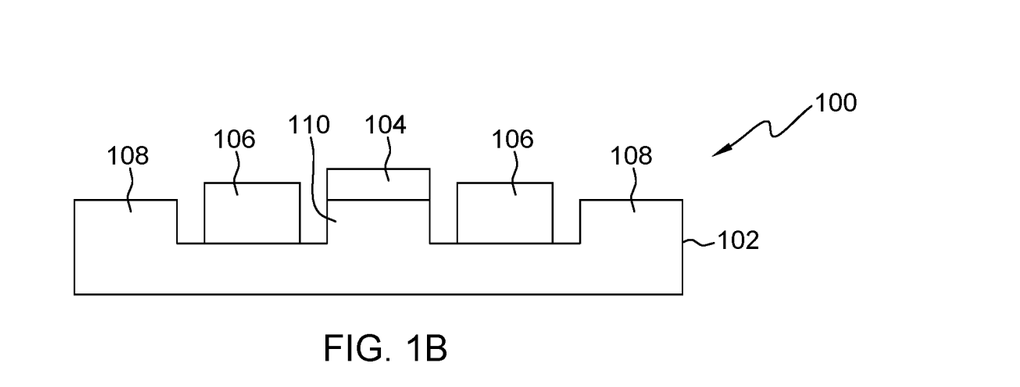
FIG. 1B depicts a side view of a corner load leveling and stabilization structure, in accordance with an embodiment of the present invention.

FIG. 1B depicts a side view of a corner load leveling and stabilization structure, in accordance with an embodiment of the present invention. The side view of corner load leveling and stabilization structure 100 illustrates the varying heights of the protruding top-tier member 104, mid-tier members 106, corner lower-tier members 108, and side lower-tier members 110. A height of top-tier member 104 is greater than a height of mid-tier members 106 and a height of mid-tier members 106 is greater than a height of either corner lower-tier members 108 or side lower-tier members 110. A top planar surface of base 102 from which the various members protrude is a level surface with 0° of pitch along the x-axis and the y-axis. In other embodiments, the top planar surface of base 102 from which the various members protrude includes a varying level surface with a pitch ranging from 0°<x<90° in the x-axis and the y-axis.

Figure 1C:
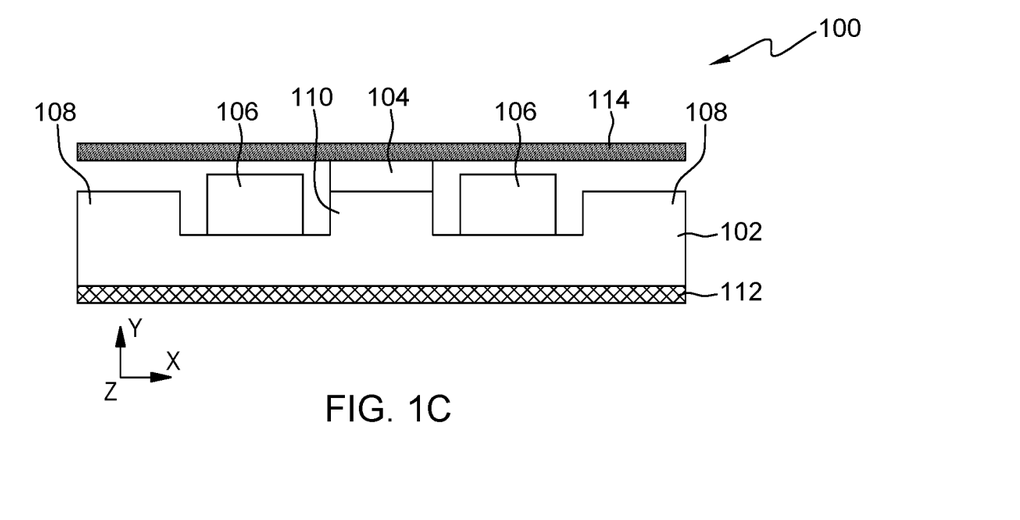
FIG. 1C depicts a side view of a corner load leveling and stabilization structure with a mounted load surface, in accordance with an embodiment of the present invention.

FIG. 1C depicts a side view of a corner load leveling and stabilization structure with a mounted load surface, in accordance with an embodiment of the present invention. In this embodiment, a bottom planar surface of base 102 of corner load leveling and stabilization structure 100 is disposed on a top planar surface of pallet 112 to support a bottom planar surface of load 114. Since a height of top-tier member 104 is greater than mid-tier members 106, corner lower-tier members 108, or side lower-tier members 110, a top planar surface of top-tier member 104 initially contacts the bottom planar surface of load 114, where a void is present between the bottom planar surface of load 114 and a top planar surface of mid-tier members 106, corner lower-tier members 108, and side lower-tier members 110. If load 114 were to experience destabilization and a weight applied to top-tier member 104 exceeded a maximum weight capacity, top-tier member 104 would buckle under load 114. As a result, load 114 would transfer to mid-tier members 106, where a top planar surface of mid-tier members 106 would contact the bottom planar surface of load 114. If load 114 were to experience even further destabilization and a weight applied to mid-tier members 106 exceeded a maximum weight capacity across all mid-tier members 106, one or more mid-tier members 106 would buckle under load 114. As a result, load 114 would transfer to corner lower-tier members 108 and side lower-tier members 110, where a top planar surface of both corner lower-tier members 108 and side lower-tier members 110 would contact the bottom planar surface of load 114.

Figure 2A:
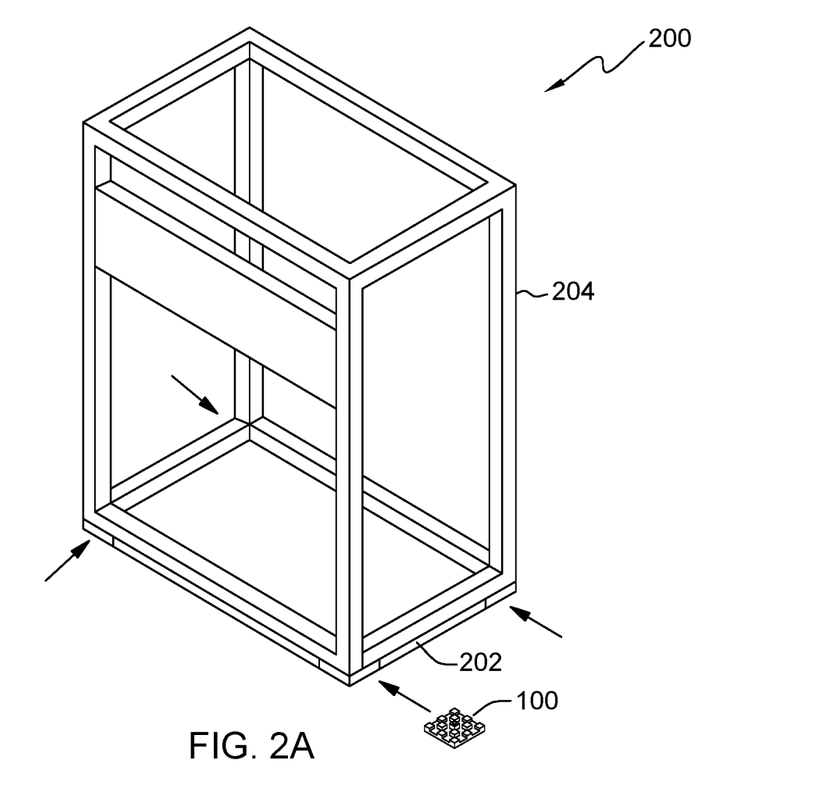
FIG. 2A depicts a three-dimensional view of multiple corner load leveling and stabilization structure disposed under a server frame, in accordance with an embodiment of the present invention.

FIG. 2A depicts a three-dimensional view of multiple corner load leveling and stabilization structure disposed under a server frame, in accordance with an embodiment of the present invention. In this embodiment, packaged load 200 includes server frame 204 disposed on four corner load leveling and stabilization structures 100, where each of the four corner load leveling and stabilization structure 100 are disposed on a top planar surface of movable platform 202, such as, a pallet. Server frame 204 represents a load with a weight that is non-uniform and asymmetrically distributed due to a bias mass located on a single side and elevated portion of server frame 204. The bias mass located on the single side and elevated portion of server frame 204 increases susceptibility of the load shifting or tipping when encountering lateral motions. Though the four corner load leveling and stabilization structures 100 are disposed on each corner of server frame 204, corner load leveling and stabilization structures 100 can be disposed along any point of the bottom planar surface of server rack 204.

Figure 2B:
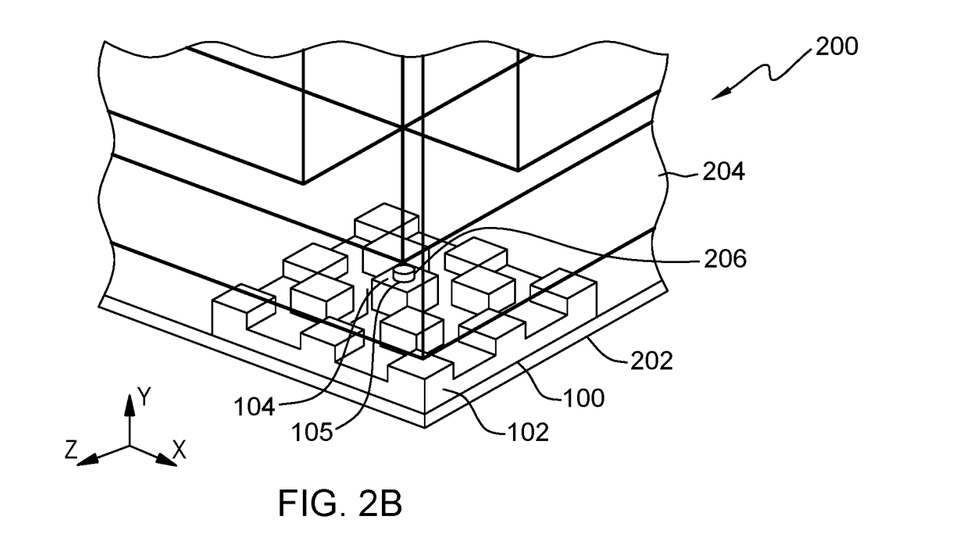
FIG. 2B depicts an enhanced three-dimensional view of a corner load leveling and stabilization structure disposed under a server frame, in accordance with an embodiment of the present invention.

FIG. 2B depicts an enhanced three-dimensional view of a corner load leveling and stabilization structure disposed under a server frame, in accordance with an embodiment of the present invention. As discussed in FIG. 2A, packaged load 200 includes server frame 204 disposed on four corner load leveling and stabilization structures 100, where each of the four corner load leveling and stabilization structure 100 are disposed on a top planar surface of movable platform 202. Cavity 105 on top-tier member 104 secures server frame 204 to corner load leveling and stabilization structure 100 utilizing pin 206. Pin 206 is removable and ensures that a bottom plana surface of server frame 204 does not slide on a top planar surface of top-tier member 104. Server frame 204 can include a dedicate hole through which pin 206 is disposed, securing server frame 204 to corner load leveling and stabilization structure 100. In another embodiment, server frame 204 utilizes a temporary and removable bracket with a dedicated hole through which pin 206 is disposed, securing server frame 204 to corner load leveling and stabilization structure 100 via the removable bracket.

Figure 3A:
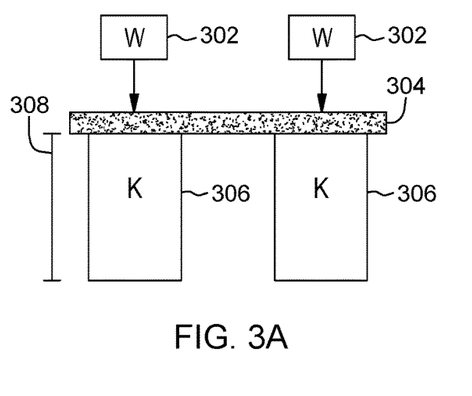
FIG. 3A depicts an initial position for a uniform load on a uniform stiffness structure.

FIG. 3A depicts an initial position for a uniform load on a uniform stiffness structure. The uniform load is represented by weights 302 symmetrically applied to both ends of platform 304. The uniform stiffness structure is represented by left and right structures 306, where structures 306 support weights 302 and platform 304. Since both, left and right structures 306 have the same stiffness $k=F/\delta$ ($F$=Force and $\delta$=displacement), left and right structures 306 have similar resistance to deformation when weights 302 are applied to platform 304. Distance 308 represents an initial height of structures 306 prior to the buckling and deformation occurring due to the applied weights 302 to platform 304.

Figure 3B:
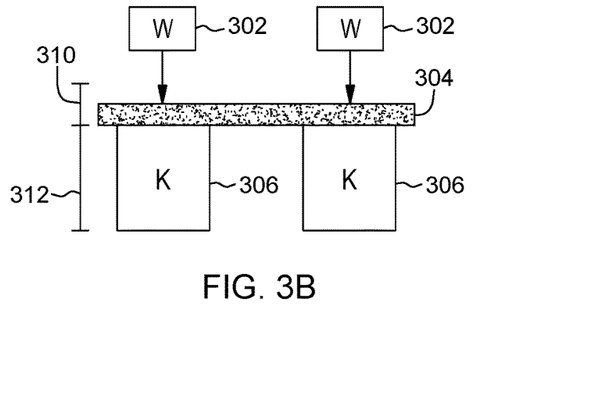
FIG. 3B depicts a final position for a uniform load on a uniform stiffness structure.

FIG. 3B depicts a final position for a uniform load on a uniform stiffness structure. Distance 312 represents a final height of structures 306 subsequent to the buckling and deformation occurring due to weights 302 being applied to platform 304 in a uniform manner. Distance 310 represents a height of deformation that occurred for each of structures 306, due to each of structures 306 having a uniform stiffness k. Due to weight (W) being applied uniformly at each end of platform 304, structures 306 with uniform stiffness k are able to provide adequate support and leveling of platform 304.

Figure 4A:
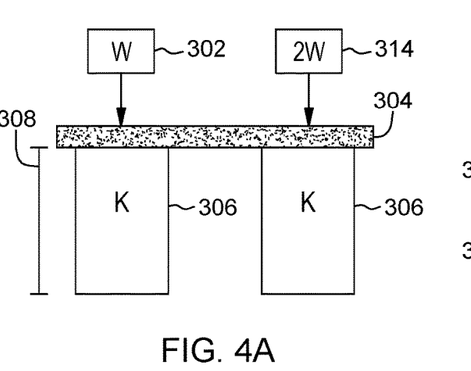
FIG. 4A depicts an initial position for a biased load on a uniform stiffness structure.

FIG. 4A depicts an initial position for a biased load on a uniform stiffness structure. The bias load is represented by weight 302 and weight 314 asymmetrically applied on either end of platform 304, where weight 314 is twice that of weight 302. The uniform stiffness structure is represented by left and right structures 306, where structures 306 support weight 302, weight 314, and platform 304. Since both, left and right structures 306 have the same stiffness k=F/δ (F=Force and δ=displacement), left and right structures 306 have similar resistance to deformation when weight 302 and weight 314 are applied to platform 304. Distance 308 represents an initial height of structures 306 prior to the buckling and deformation occurring due to the applied weight 302 and weight 314 to platform 304.

Figure 4B:
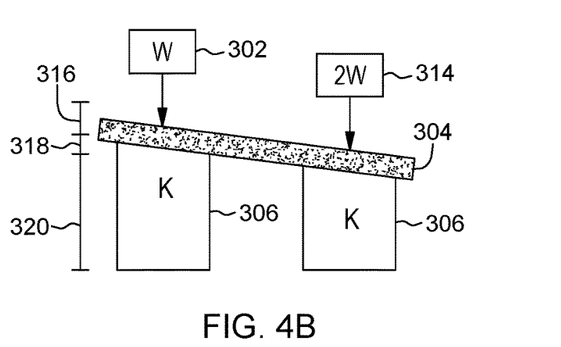
FIG. 4B depicts a final position for a biased load on a uniform stiffness structure.

FIG. 4B depicts a final position for a biased load on a uniform stiffness structure. Distance 320 represents a final height of right structure 306 subsequent to the buckling and deformation occurring due to weight 302 and 314 being applied to platform 304 in an asymmetric manner. Distance 318 represents a difference in height of deformation that occurred for between the left and the right structures 306. Distance 316 represents a final height of left structures 306 subsequent to the buckling and deformation occurring due to weight 302 being applied to platform 304 in an asymmetric manner. Due to distance 318 being a value of x>0, the load on platform 304 becomes tilted, increasing a possibility of a load on platform 304 tipping over. The greater the value of distance 318, the greater the possibility of the load on platform 304 tipping over. Due to weight (W) and (2W) being applied non-uniformly at each end of platform 304, structures 306 with uniform stiffness k are unable to provide adequate support and leveling of platform 304. Embodiments of the present invention address the inadequate support and leveling of non-uniformly loads and are discussed in further detail with regards to FIGS. 5A and 5B.

Figure 5A:
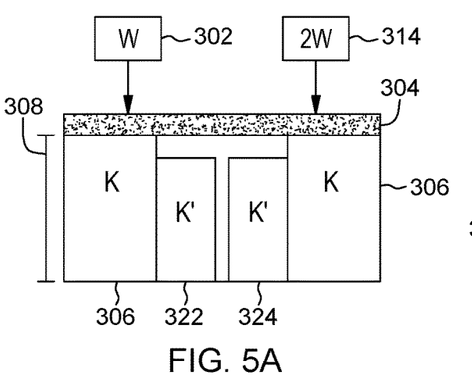
FIG. 5A depicts an initial position for a biased load on a varying stiffness structure, in accordance with an embodiment of the present invention.

FIG. 5A depicts an initial position for a biased load on a varying stiffness structure, in accordance with an embodiment of the present invention. To minimize distance 318 as discussed in FIG. 4B, varying stiffness structures 322 and 324 are utilized to support the biased load in conjunction with structures 306. The bias load is represented by weight 302 and weight 314 asymmetrically respectively applied on a left and right end of platform 304, where weight 314 is twice that of weight 302. As previously discussed, left and right structures 306 have the same stiffness k=F/δ (F=Force and δ=displacement), but varying stiffness structures 322 and 324 have a different stiffness value of k'=F/δ'. Distance 308 represents an initial height of structures 306, 322, and 324 prior to the buckling and deformation occurring due to the applied weight 302 and weight 314 to platform 304.

Figure 5B:
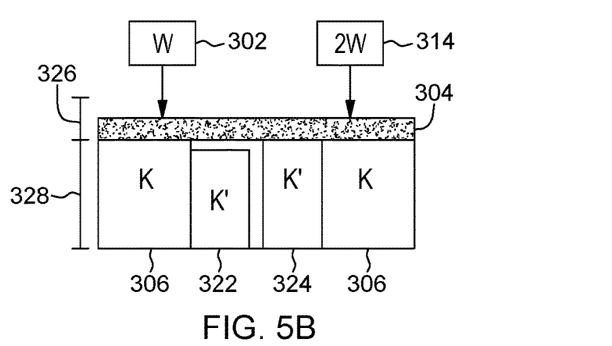
FIG. 5B depicts a final position for a biased load on a varying stiffness structure, in accordance with an embodiment of the present invention.

FIG. 5B depicts a final position for a biased load on a varying stiffness structure, in accordance with an embodiment of the present invention. Distance 328 represents a final height of structures 306 subsequent to the buckling and deformation occurring due to weight 302 and 314 being applied to platform 304 in an asymmetric manner. Distance 326 represents a height of deformation that occurred for each of structures 306, due to platform 304 contacting structure 324 and preventing further deformation of right structure 306 due to the asymmetrical load of weight 302 and weight 314.

Figure 6A:
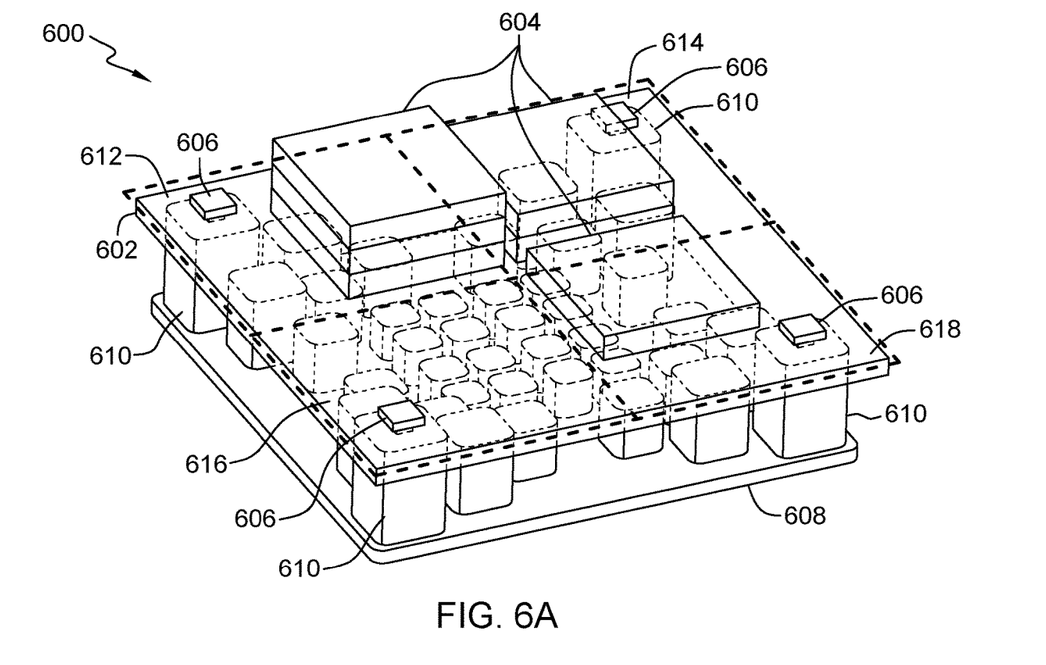
FIG. 6A depicts a three-dimensional and transparent view of a load leveling and stabilization structure with a mounted load surface, in accordance with an embodiment of the present invention.

FIG. 6A depicts a three-dimensional and transparent view of a load leveling and stabilization structure with a mounted load surface, in accordance with an embodiment of the present invention. In this embodiment, load leveling and stabilization structure 600 includes load platform 602 with multiple load items 604, where the multiple load items 604 are positioned asymmetrically and non-uniformly on load platform 602. For multiple load items 604, each load item (plate) is of equal mass creating an unequal weight distribution on each corner of load platform 602. Compared to corner load leveling and stabilization structure 100 previously discussed in FIGS. 1A-1C positioned at two or more points below a platform, load leveling and stabilization structure 600 is a single structure that supports load platform 602. Four pins 606 secure load platform 602 to a top planar surface of four top-tier structures 610 positioned at each corner of support platform 608, where each pin 606 is removeable and extends through load platform 602 and a portion of top-tier structure 602 along the y-axis. In this embodiment, a plurality of structures protrude (e.g., top-tier structures 610) from support platform 608 in a symmetrical manner, where four levels of structures exist to provide leveling and stabilization of load platform 602. Since pins 606 are positioned at each corner of load platform 602, pins 606 prevent load platform from sliding off (i.e., x-axis direction) the top planar surface of top-tier structures 610 as the plurality structures experiences buckling and deformation.

For discussion purposed, load platform 602 is divided into quadrants defined by sections 612, 614, 616, and 616. In this example, section 612 includes three load items 604 disposed on the top surface of load platform 602, section 614 includes two load items 604 disposed on the top surface of load platform 602, section 616 includes no load items 604 disposed on the top surface of load platform 602, and section 618 includes one load item 604 disposed onto load platform 602. Subsequent to the six load items 604 being disposed onto load platform 602, sections 612 and 614 each experience three tiers (i.e., top-tier, mid-tier, and lower-tier) of structure engagement for leveling and stabilizing load platform 602. Sections 616 and 618 experience two tiers (i.e., top-tier and mid-tier) of structure engagement for leveling and stabilizing load platform 602. Though an amount of tiers of structure engagement for leveling and stabilizing load platform 602 are similar across some sections, an amount of deformation of each tier structure varies across each section.

Figure 6B:
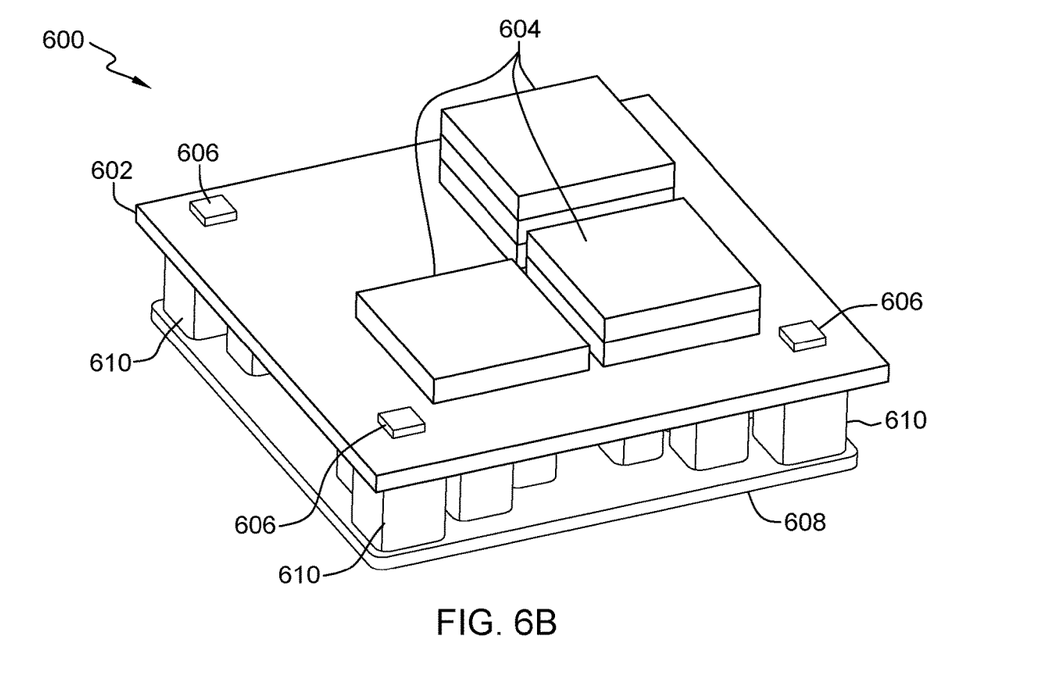
FIG. 6B depicts a three-dimensional and solid view of a load leveling and stabilization structure with a mounted load surface, in accordance with an embodiment of the present invention.

FIG. 6B depicts a three-dimensional and solid view of a load leveling and stabilization structure with a mounted load surface, in accordance with an embodiment of the present invention. Platform 608 with the plurality of protruding structures of load leveling and stabilization structure 600 can be placed on a movable platform, such as a pallet. If support platform 608 is placed on the movable platform, pins 606 can extend through load platform 602, top-tier structures 610, and a portion of the movable platform to prevent either load platform 602 from sliding off the top planar surface of top-tier structures 610 in the x-axis direction or support platform 606 from sliding off a top planar surface of the movable platform in the x-axis direction. In an alternative embodiment, support platform 608 is integrated into (i.e., shared with) a top surface of a pallet, where the pallet and load leveling and stabilization structure 600 are a single structure for supporting multiple load items 604 positioned on load platform 602.

Figure 6C:
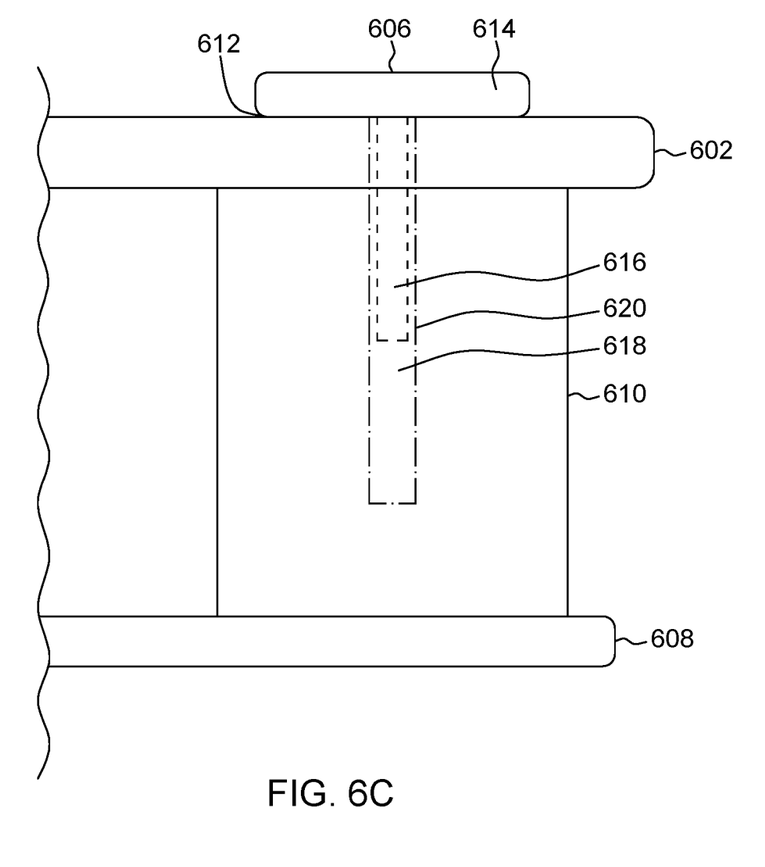
FIG. 6C depicts a side view of a pin for coupling a load leveling and stabilization structure to a mounted load surface, in accordance with an embodiment of the present invention.

FIG. 6C depicts a side view of a pin for coupling a load leveling and stabilization structure to a mounted load surface, in accordance with an embodiment of the present invention. In this embodiment, pin 606 includes top 614 and column 616, where a bottom planar surface of top 614 contacts a top planar surface of load platform 602 at point 612 when pin 606 is disposed through a hole in load platform 602 and top-tier structure 610. Column 616 of pin 606 is positioned in sleeve 620, where portion 618 provides column 616 an area to move if top-tier structure 610 buckles and deforms under a load applied to load platform 602. In other embodiments, portion 618 extends through support platform 608 to provide column 616 an increased amount of area to move during buckling and deformation event. Sleeve 620 can include a metallic material spanning a length and circumference, to provide additional structural rigidity to ensure column 616 can slide in the y-direction down sleeve 620. In another embodiment, column 616 is a bolt and sleeve 620 is at least partially threaded to accept pin 606 is screwed into load platform 602 and top-tier structure 610.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. An apparatus for leveling and stabilizing weight biased loads, the apparatus comprising:
   a base with a plurality of structural members protruding from a top planar surface of the base, wherein the base is integrated into a top surface of a pallet;
   the plurality of structural members includes two or more tiers, wherein each of the two or more tiers includes at least one structural member from the plurality of structural members;
   a platform disposed on a first tier out of the two or more tiers of the plurality of structural members, wherein a bottom planar surface of the platform is disposed on a top planar surface of at least one structural member of the first tier,
   wherein each of the two or more tiers of the plurality of structural members provides sequential load support for a weight biased load disposed on the platform;
   wherein the top planar surface of the at least one structural member of the first tier includes a first cavity for a removable pin;
   a second tier out of the two or more tiers of the plurality of structural members, wherein a void is present between the bottom planar surface of the platform and a top planar surface of at least one structural member of the second tier; and
   a sleeve positioned along a length and a circumference of the first cavity for guiding the removable pin, wherein the sleeve provided structural rigidity during a deformation of the at least one structural member of the first tier.

2. The apparatus of claim 1, wherein the sleeve is partially threaded along the length of the cavity.

3. The apparatus of claim 1, further comprising:
   a first cavity positioned on the top planar surface of the at least one structural member of the first tier, wherein a shape of the first cavity matches a first protruding feature on the bottom planar surface of the platform.

4. The apparatus of claim 3, further comprising:
   a second cavity positioned on the top planar surface of the at least one structural member of the second tier, wherein a shape of the second cavity matches a second protruding feature on the bottom planar surface of the platform.

5. The apparatus of claim 1, wherein a first structural stiffness value for the first tier of the at least one structural member from the plurality of structural members is greater than a second structural stiffness value for the second tier of the at least one structural member from the plurality of structural members.

6. The apparatus of claim 1, wherein a first structural stiffness value for the first tier of the at least one structural member from the plurality of structural members is less than a second structural stiffness value for the second tier of the at least one structural member from the plurality of structural members.

7. The apparatus of claim 1, wherein the first tier of the at least one structural member from the plurality of structural members is positioned to match one or more protruding features of the bottom planar surface of the platform.

8. The apparatus of claim 1, wherein the second tier of the at least one structural member from the plurality of structural members is positioned to match one or more protruding features of the bottom planar surface of the platform.

9. The apparatus of claim 1, wherein the first cavity of the top planar surface of the at least one structural member of the first tier at least partially aligns with a hole extending between a top planar surface of the platform and the bottom planar surface of the platform.

10. The apparatus of claim 1, wherein a material for the plurality of structural members is selected from a group consisting of: rubber, foam, or honeycomb structured cardboard.

11. The apparatus of claim 1, wherein a bottom planar surface of the base is disposed on a top planar surface of a movable platform.

12. The apparatus of claim 1, wherein a bottom planar surface of the base is shared with a top planar surface of a movable platform.

* * * * *